United States Patent
Hanafusa

(10) Patent No.: US 7,341,796 B2
(45) Date of Patent: Mar. 11, 2008

(54) COPPER FOIL HAVING BLACKENED SURFACE OR LAYER

(75) Inventor: Mikio Hanafusa, Ibaraki (JP)

(73) Assignee: Nippon Mining & Metals Co., Ltd, Minato-Ku, Tokyo (JP)

(*) Notice: Subject to any disclaimer, the term of this patent is extended or adjusted under 35 U.S.C. 154(b) by 1 day.

(21) Appl. No.: 10/597,460

(22) PCT Filed: Jan. 25, 2005

(86) PCT No.: PCT/JP2005/000884

§ 371 (c)(1),
(2), (4) Date: Jul. 26, 2006

(87) PCT Pub. No.: WO2005/079130

PCT Pub. Date: Aug. 25, 2005

(65) Prior Publication Data

US 2007/0141377 A1   Jun. 21, 2007

(30) Foreign Application Priority Data

Feb. 17, 2004   (JP)   ............... 2004-039179

(51) Int. Cl.
*B32B 15/01* (2006.01)
*B32B 15/04* (2006.01)
*B32B 15/20* (2006.01)

(52) U.S. Cl. .................. 428/674; 428/220; 428/332; 428/336; 428/340; 428/607; 428/675; 428/678; 428/680; 428/687

(58) Field of Classification Search ................ 428/674, 428/606, 607, 613, 614, 666, 658, 671, 675, 428/678, 680, 687, 213, 219, 220, 332, 336, 428/340, 457
See application file for complete search history.

(56) References Cited

U.S. PATENT DOCUMENTS

| 6,429,832 B1 | 8/2002 | Harada et al. |
| 6,638,642 B2 | 10/2003 | Kitano et al. |
| 6,733,869 B2 | 5/2004 | Arakawa et al. |
| 6,833,198 B2 | 12/2004 | Sakamoto et al. |
| 6,960,391 B2 | 11/2005 | Natsume et al. |
| 2002/0182432 A1 | 12/2002 | Sakamoto et al. |
| 2004/0170857 A1* | 9/2004 | Yoshihara et al. .......... 428/553 |

FOREIGN PATENT DOCUMENTS

JP    2002-341783 A    11/2002

OTHER PUBLICATIONS

Esp@cenet database, one page English Abstract of JP 2003-201597, Jul. 2003.

(Continued)

*Primary Examiner*—Michael E. Lavilla
(74) *Attorney, Agent, or Firm*—Howson & Howson LLP

(57) ABSTRACT

A copper foil with a blackened surface or layer wherein one or both surfaces of a copper foil is subject to black treatment, and having a color difference $\Delta L^* \leq -70$ and chroma $C^* \leq 15$ of a black-treated surface when measured by a color difference meter represented by black; $\Delta L^*=-100$, white; $\Delta L^*=0$. The copper foil with a blackened surface or layer is especially useful for a plasma display panel (PDP) and has superior shielding characteristics of effectively shielding electromagnetic waves, near infrared rays, stray light, outside light and the like, has sufficient contrast, has a deep blackened color, is able to limit the reflected light of incoming light from the outside and reflected light of outgoing light from a plasma display panel, and has superior etching characteristics.

24 Claims, 1 Drawing Sheet

OTHER PUBLICATIONS

Esp@cenet database, one page English Abstract of JP 2003-218583, Jul. 2003.
Esp@cenet database, one page English Abstract of JP 2002-009484, Jan. 2002.
Esp@cenet database, one page English Abstract of JP 2001-147312, May 2001.
Esp@cenet database, one page English Abstract of JP 2001-217589, Aug. 2001.

* cited by examiner

COPPER FOIL HAVING BLACKENED SURFACE OR LAYER

BACKGROUND OF THE INVENTION

The present invention generally relates to a copper foil with a blackened surface or layer, and in particular relates to a copper foil with a blackened surface or layer that is especially useful for a plasma display panel (PDP) and has superior shielding characteristics of effectively shielding electromagnetic waves, near infrared rays, stray light, outside light and the like.

Recently, a plasma display panel (PDP) characterized in that it is easy to manufacture a large-sized screen and having a fast drive speed is being used in various display devices at a staggering rate.

This plasma display panel has a structure and function of generating plasma with a gaseous discharge, exciting phosphor disposed in the cell with the line spectrum of the generated ultraviolet range, and generating light of a visible region.

When plasma is generated with a gaseous discharge as described above, in addition to the line spectrum of an ultraviolet range used in phosphor, a line spectrum of a wavelength in a wide range up to the near infrared region will be generated.

Since the wavelength of the near infrared region generated from the plasma display panel described above is close to the wavelength used in optical communication, there is a problem in that a malfunction will occur when the two wavelengths are positioned at a close range, and the generation of electromagnetic waves such as microwaves and infrasonic waves will also become a problem.

A shield layer formed from a copper foil is generally provided to the front face of the panel in order to shield the leakage of electromagnetic waves or the line spectrum of the near infrared region. Normally, this copper foil is formed into a thin linear mesh shape by etching and configures a shield layer. Incidentally, resin such as PET is further coated on the top surface of this copper shield layer via an adhesive.

Nevertheless, since the copper foil as the fundamental shield layer described above has metallic luster, there is a problem in that it reflects light from outside the panel, contrast of the screen becomes inferior, reflects light generated inside the screen, optical transmission will deteriorate, and visibility of the display panel will deteriorate.

In light of the foregoing problems, blackening treatment is performed to a copper foil shield layer that is effective in shielding the leakage of electromagnetic waves and the line spectrum of the near infrared region.

As a conventional copper foil, known is a copper foil with a black surface coating formed thereon, and this is generally referred to as a black-treated copper foil. Nevertheless, this kind of copper foil was used in forming circuits in electronics devices, and was primarily demanded of adhesiveness with the resin or drillability with a laser beam, and was not demanded of strict surface conditions such as the smoothness or uniformity of the black-treated coating.

Nevertheless, characteristics of the copper foil that appear at the front surface of the plasma display panel directly influence the visibility of the display panel, and the development of a copper foil capable of satisfying such demands is being desired.

Although several characteristics are demanded in the black-treated coating of a plasma display panel copper foil; in particular, 1) sufficient contrast and blackness, 2) inhibition of reflected light of incoming light from the outside and reflected light of outgoing light from the plasma display panel, and 3) enablement of linear etching at a width of 5 to 30 μm, optical value of 10 μm, and pitch of 100 to 500 μm upon forming a pattern on the copper foil are demanded.

In light of the above, a shield layer formed from a copper foil is demanded of a function as a protective film of the plasma display panel, function of preventing electromagnetic waves, function of preventing near infrared rays, function of correcting the tone, function of preventing stray light, function of blocking outside light, and particularly the quality and characteristics of a blackening-treated film. Conventionally, it could be said that there was no plasma display panel copper foil that sufficiently satisfied the foregoing functions.

As conventional technology, there is technology of forming a black-edged layer at the periphery on one surface of a glass substrate as a transparent base material, forming a PET (polyethylene terephthalate) film as a transparent film on the surface thereof via a first adhesive layer, and forming a copper layer pattern as a metallic layer pattern on the PET film via an adhesive layer, wherein the copper layer pattern is formed covering the periphery of the PET film, and blackening treatment is performed to both surfaces and all side faces thereof (e.g., refer to Patent Document 1), and there is technology relating to a surface discharge plasma display panel and plasma display module in which a common electrode and scanning electrode are formed on the same surface and surface discharge is generated between the two electrodes (e.g., refer to Patent Document 2).

Further, there is technology relating to a filter device in which the transparency of the copper foil mesh filter for shielding the leaked electromagnetic waves of the optical filter provided to the front face of the PDP has been improved (e.g., refer to Patent Document 3), and there is technology of manufacturing an electromagnetic wave shield by laminating a porous copper foil on a transparent polymer film, etching the copper foil with the wet method, and, for instance, forming a lattice pattern so as to prepare a laminated body with a portion having optical transparency, and combining such laminated body, transparent support and antireflection film (e.g., refer to Patent Document 4).

[Patent Document 1] Japanese Patent Laid-Open Publication No. 2002-9484

[Patent Document 2] Japanese Patent Laid-Open Publication No. 2000-89692

[Patent Document 3] Japanese Patent Laid-Open Publication No. 2001-147312

[Patent Document 4] Japanese Patent Laid-Open Publication No. 2001-217589

SUMMARY OF THE INVENTION

The present invention was devised in view of the foregoing problems, and an object thereof is to provide a copper foil with a blackened surface or layer that is especially useful for a plasma display panel (PDP) and has superior shielding characteristics of effectively shielding electromagnetic waves, near infrared rays, stray light, outside light and the like, has sufficient contrast, has a deep blackened color, is able to limit the reflected light of incoming light from the outside and reflected light of outgoing light from a plasma display panel, and has superior etching characteristics.

In light of the above, the present invention provides:

1) A copper foil with a blackened surface or layer wherein one or both surfaces of a copper foil is subject to black treatment, and having a color difference $\Delta L^* \leq -70$ and chroma C*≦15 of a black-treated surface when measured by a color difference meter represented by black; ΔL*=−100, white; ΔL*=0;

2) The copper foil with a blackened surface or layer according to 1) above, wherein one or both surfaces of a copper foil is subject to black treatment, and the surface subject to black treatment has a glossiness ≦15;

3) The copper foil with a blackened surface or layer according to 1) or 2) above, wherein the coarsened grains of a processed surface in which one or both surfaces of a copper foil is subject to black treatment is 1 μm or less, surface roughness Ra of the surface is 0.5 μm or less, Rt is 4.0 μm or less, and Rz is 3.5 μm or less;

4) The copper foil with a blackened surface or layer according to any one of 1) to 3) above having a black processed surface coated with at least one or more types selected from Co, Ni—Cu, Co—Cu and Ni—Co—Cu by electro plating;

5) The copper foil with a blackened surface or layer according to 4) above, wherein the Ni mass of deposit per unit area in the Ni—Cu plating process is 200 to 1000 mg/m$^2$, or the Ni+Co mass of deposit per unit area of a plated surface subject to the Ni or Ni—Co plating process after the Ni—Cu plating process is 250 to 1500 mg/m$^2$;

6) The copper foil with a blackened surface or layer according to 4) above, wherein the Ni+Co mass of deposit per unit area in the Ni—Co—Cu plating process is 130 to 1000 mg/m$^2$, or the Ni+Co mass of deposit per unit area of a plated surface subject to the Ni or Ni—Co plating process after the Ni—Co—Cu plating process is 250 to 1500 mg/m$^2$;

7) The copper foil with a blackened surface or layer according to 4) above, wherein the Co mass of deposit per unit area in the Co—Cu plating process is 300 to 1000 mg/m$^2$, or the Ni+Co mass of deposit per unit area of a plated surface subject to the Ni or Ni—Co plating process after the Co—Cu plating process is 350 to 1500 mg/m$^2$;

8) The copper foil with a blackened surface or layer according to 4) above, wherein the Co mass of deposit per unit area in the Co plating process is 1000 to 5000 mg/m$^2$, or the Ni+Co mass of deposit per unit area of a plated surface subject to the Ni or Ni—Co plating process after the Co plating process is 1050 to 2000 mg/m$^2$;

9) The copper foil with a blackened surface or layer according to any one of 1) to 8) above, wherein the copper foil is an electrolytic copper foil or rolled copper foil of 8 to 18 μm;

10) The copper foil with a blackened surface or layer according to any one of 1) to 9) above, further comprising a rust prevention processed layer on the layer subject to black treatment;

11) The copper foil with a blackened surface or layer according to 10) above, wherein the rust prevention processed layer is one or more types selected from Cr, Zn, Zn—Ni and Zn—Ni—P; and 12) The copper foil with a blackened surface or layer according to any one of 1) to 11) above, wherein the copper foil is a plasma display copper foil.

The copper foil with a blackened surface or layer according to the present invention yields a superior effect in that it has superior shielding characteristics of effectively shielding electromagnetic waves, near infrared rays, stray light, outside light and the like, has sufficient contrast, has a deep blackened color, is able to limit the reflected light of incoming light from the outside and reflected light of outgoing light from a plasma display panel, and has superior etching characteristics.

DETAILED DESCRIPTION OF THE INVENTION

In the copper foil with a blackened surface or layer of the present invention, one or both surfaces of a copper foil are subject to black treatment. The blackened surface or layer has a color difference ΔL*≦−70 and chroma C*≦−15 of a black-treated surface when measured by a color difference meter represented by black; ΔL*=−100, white; ΔL*=0.

As a result, in addition to obtaining a shield property of effectively shielding electromagnetic waves, near infrared rays, stray light, outside light and the like, the contrast will be sufficient, it will have a deep blackened color, and it will be possible to effectively inhibit the reflected light of incoming light from the outside and reflected light of outgoing light from a plasma display panel.

Further, it is desirable that the surface subject to black treatment has a glossiness ≦15. Incidentally, the brightness and chroma will be based on the following standard.

In other words, the L*a*b* color system is standardized with JISZ8729, and brightness is represented with L*, and hue and chroma are represented with a*, b*, a*, b* show the direction of color, and a* shows the red direction, −a* shows the green direction, b* shows the yellow direction, and −b* shows the blue direction. Hue (c*) is represented with $c^* = [(a^*)^2 + (b^*)^2]^{1/2}$, and the color becomes a dull color the smaller c* becomes.

When measuring with the color difference meter, brightness L* is measured by the difference (Δ) with the reference color (white or black). In this Description, white is the reference color, and ΔL=0 represents white and ΔL=−100 represents black.

Regarding the glossiness, in the case of a 60-degree incidence angle in a glass surface having a refractive index of 1.567 with the JIS standard, reflectivity 10% is glossiness 100%. In other words, glossiness represents the degree that the light normally reflected off the surface of the article that it hit. In this Description, glossiness was measured with a commercially available glossiness meter at a measurement angle of 60 degrees.

Further, with the copper foil with a blackened surface or layer of the present invention, the coarsened grains of a processed surface in which one or both surfaces of a copper foil is subject to black treatment is 1 μm or less, surface roughness Ra of said surface is 0.5 μm or less, Rt is 3.0 μm or less, and Rz is 3.0 μm or less. It is possible to improve the etching precision by reducing the surface roughness as described above.

Figure 1:
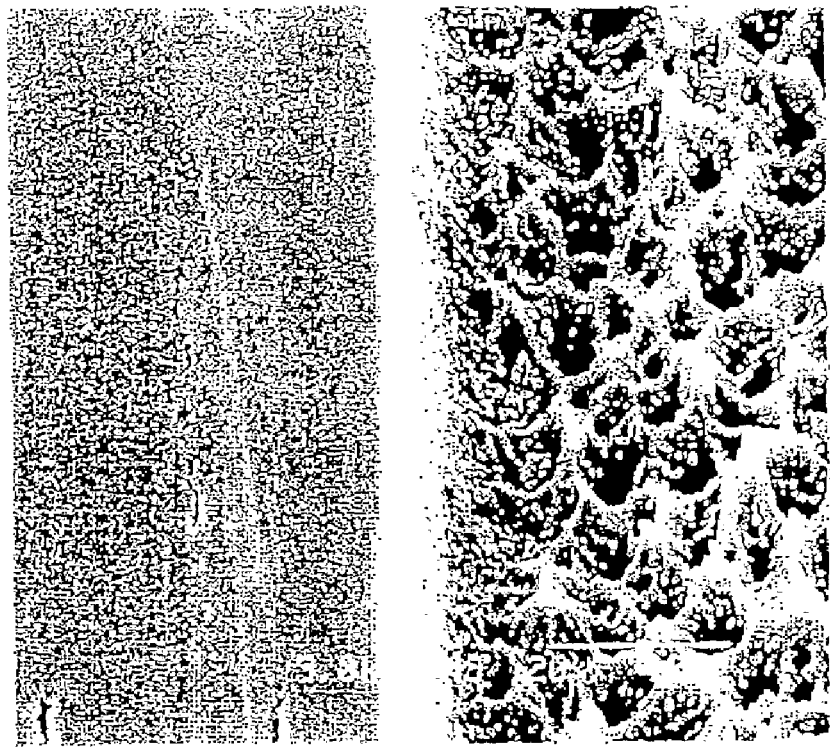
FIG. 1 is an electron microscope photograph of an etched surface of an electrolytic copper foil in which the size of the coarsened grains is 2 μm.

For example, the surface roughness of a 12 μm JTC foil (manufactured by Nikko Materials Co., Ltd.) as a standard electrolytic copper foil is Ra 0.7 μm, Rt 5.5 μm, Rz 5.1 μm, and the size of the coarsened grains is 2 μm. When this copper foil is etched, coarsened grains will remain as shown in FIG. 1, and etching cannot be performed linearly.

Figure 2:
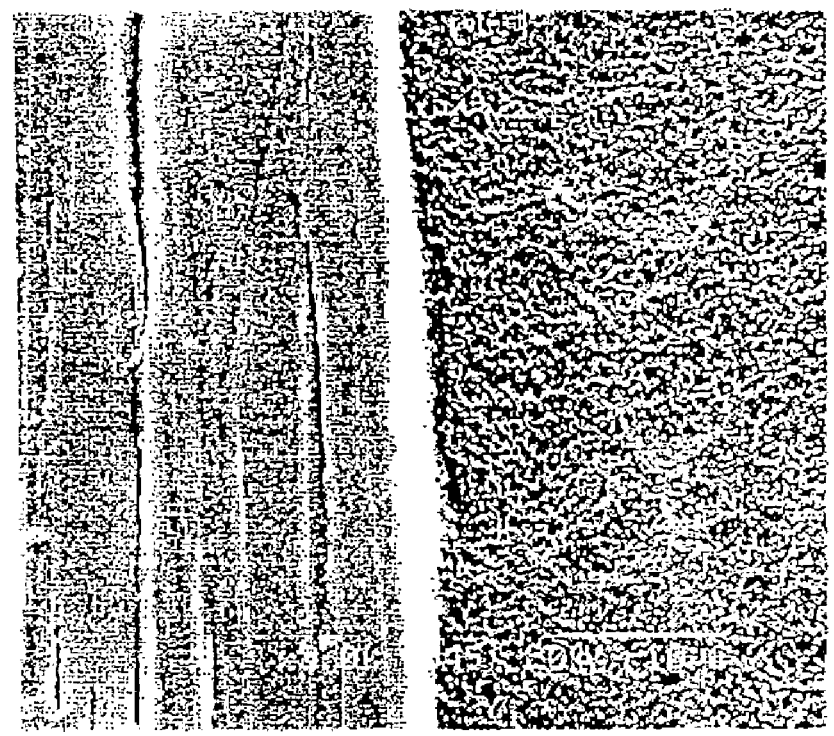
FIG. 2 is an electron microscope photograph of an etched surface of an electrolytic copper foil in which the size of the coarsened grains of a surface subject to black treatment is 1 μm or less.

With the present invention, when the coarsened grains of a processed surface in which one or both surfaces of a copper foil is subject to black treatment is 1 μm or less, surface roughness Ra of said surface is 0.5 µm or less, Rt is 4.0 µm or less, and Rz is 3.5 µm or less, as shown in FIG. 2, it is possible to easily perform linear etching with a width of 5 to 30 µm, and a pitch of 100 to 500 µm.

The copper foil with a blackened surface or layer, for instance, can be formed into a blackened surface or layer coated with at least one or more types selected from Co, Ni, Ni—Co , Ni—Cu, Co—Cu and Ni—Co—Cu by electro plating.

As the preferable examples thereof, there are the following examples 1) to 4). Nevertheless, the present invention is not necessarily limited thereto, and other treatment may be performed as required.

1) A blackened surface or layer subject to the Ni—Cu plating process wherein the Ni mass of deposit per unit area is 200 to 1000 mg/m$^2$, or a blackened surface or layer subject to the Ni or Ni—Co plating process wherein the Ni+Co mass of deposit per unit area of a plated surface after the Ni—Cu plating process is 250 to 1500 mg/m$^2$.

2) A blackened surface or layer subject to the Ni—Co—Cu plating process wherein the Ni+Co mass of deposit per unit area is 130 to 1000 mg/m$^2$, or a blackened surface or layer subject to the Ni or Ni—Co plating process wherein the Ni+Co mass of deposit per unit area of a plated surface after the Ni—Co—Cu plating process is 250 to 1500 mg/m$^2$.

3) A blackened surface or layer subject to the Co—Cu plating process wherein the Co mass of deposit per unit area is 300 to 1000 mg/m2, or a blackened surface or layer subject to the Ni or Ni—Co plating process wherein the Ni+Co mass of deposit per unit area of a plated surface after the Co—Cu plating process is 350 to 1500 mg/m$^2$.

4) A blackened surface or layer subject to the Co plating process wherein the Co mass of deposit per unit area is 1000 to 5000 mg/m2, or a blackened surface or layer subject to the Ni or Ni—Co plating process wherein the Ni+Co mass of deposit per unit area of a plated surface after the Co plating process is 1050 to 2000 mg/m$^2$.

The plating solution and plating conditions, and the coat plating solution and plating conditions for forming a blackened surface or layer are as follows.

[Plating Solution and Plating Conditions for Forming Blackened Surface or Layer]

(Co Plating Solution)
Co.: 5 to 30 g/L
pH: 2 to 4
Solution temperature: 20 to 60
Current density: 10 to 50 A/dm$^2$ (Cu—Co Plating Solution)
Cu: 5 to 30 g/L
Co: 10 to 30 g/L
pH: 2 to 4
Solution temperature: 20 to 60
Current density: 30 to 50 A/dm$^2$ (Cu—Ni Plating Solution)
Cu: 5 to 30 g/L
Ni: 10 to 30 g/L
pH: 2 to 4
Solution temperature: 20 to 55
Current density: 30 to 55 A/dm$^2$ (Cu—Ni—Co Plating Solution)
Cu: 5 to 30 g/L
Ni: 5 to 30 g/L
Co: 5 to 30 g/L
pH: 2 to 4
Solution temperature: 20 to 60
Current density: 30 to 60 A/dm$^2$

[Coat Plating Solution and Plating Conditions]

(Ni plating solution)
Ni: 10 to 30 g/L
pH: 2 to 3
Solution temperature: 20 to 60
Current density: 0.1 to 5 A/dm$^2$ (Ni—Co Plating Solution)
Ni: 5 to 30 g/L
Co: 5 to 30 g/L
pH: 2 to 4
Solution temperature: 20 to 60
Current density: 0.1 to 5 A/dm$^2$ As the copper foil with a blackened surface or layer of the present invention, an electrolytic copper foil or rolled copper foil of 8 to 18 µm may be used.

After forming the black plated layer of the present invention, coat plating may be further formed thereon. This coat plating contains nickel or nickel-cobalt. There is no particular limitation in the coat plating method or processing liquid. After forming the black plated layer, or after forming the coat plated layer on the black plated layer, it is also possible to further form a rust prevention processed layer thereon. As this rust prevention processed layer, one or more types selected from Cr, Zn, Zn—Ni and Zn—Ni—P may be used.

Electroplating may be used as the plating process for forming the blackened surface or layer. Further, if the amount of the blackened surface or layer is too small, sufficient blackness cannot be obtained, and if the amount is too great, the smoothness will deteriorate and etching characteristics will become inferior.

In the rust prevention processing, it goes without saying that the characteristics as a copper foil to be applied as the plasma display panel copper foil on the surface subject to plating process must not be lost, and the rust prevention processing of the present invention sufficiently satisfies such conditions. Incidentally, this rust prevention processing is able to improve the rust prevention effect without hardly influencing the shield property of shielding electromagnetic waves, near infrared rays, stray light, outside light and so on of the blackening-treated coating of the present invention, generation of anti-uneven streaks, etching characteristics, and peeling property caused by anti-powder fall.

The rust prevention processing can be applied to the following plating process. The following are representative examples. Incidentally, this rust prevention processing merely shows a preferred example, and the present invention shall not be limited thereby.

(Cr Rust Prevention)
Cr(CrO$_3$): 2 to 10 g/L
pH: 3 to 4.5
Solution temperature: 40 to 60° C.
Current density: 0.5 to 5 A/dm$^2$
Plating time: 0.5 to 10 seconds (Zn—Ni Rust Prevention)
Zn: 15 to 30 g/L
Ni: 5 to 10 g/L
pH: 3 to 4.5
Solution temperature: 30 to 45° C.
Current density: 0.1 to 5 A/dm$^2$
Plating time: 0.5 to 10 seconds

EXAMPLES

Examples of the present invention are now explained. These Examples merely illustrate a preferred example, and the present invention shall in no way be limited thereby. In other words, all modifications, other embodiments and modes covered by the technical spirit of the present invention shall be included in this invention.

Incidentally, the Comparative Examples are indicated in the latter part for comparison with the present invention.

Examples 1 to 28

An electrolytic copper foil or rolled copper foil having a thickness of 9, 12 and 18 μm was degreased, water washed, pickled and water washed, and a black plated layer was formed using the various types of plating baths described above. The plating conditions are shown in Table 1.

For degreasing, a standard alkali degreasing fluid GN cleaner 87: 30 g/L was used, and electrolytic degreasing was performed using a stainless anode at 15 A/dm², for 5 seconds, at 40° C. Further, pickling was performed for 10 seconds at room temperature with $H_2SO_4$: 100 g/L.

The results are shown in Table 2. Table 2 shows the type of plated layer, existence (type) of coat plating, color difference ΔL, chroma, glossiness, reflectance property, roughness (Ra, Rt, Rz), etching characteristic, Ni content, and Co content.

As shown in Table 2, Examples 1 to 28 of the present invention all had a color difference ΔL that was more favorable than the reference value (−70 or less), and the chroma, glossiness, reflectance property, roughness (Ra, Rt, Rz), and etching characteristics also showed favorable values, and had a suitable black plated surface or layer plated layer. This satisfies the conditions as a plasma display panel copper foil.

TABLE 1

|  | Plating Solution | Coat Plating Solution | Copper Foil | Foil Thickness (μm) | Current Density (A/dm2) | Time (sec) | Solution Temperature (° C.) | PH |
|---|---|---|---|---|---|---|---|---|
| Example 1 | Cu—Ni | — | (1) M Surface | 18 | 40 | 1.5 | 40 | 2.5 |
| Example 2 | Cu—Ni | — | (1) M Surface | 12 | 40 | 1.5 | 40 | 2.5 |
| Example 3 | Cu—Ni | — | (1) M Surface | 9 | 35 | 2.2 | 40 | 2.5 |
| Example 4 | Cu—Ni | Ni—Co | (2) M Surface | 18 | 40 | 1.5 | 40 | 2.5 |
| Example 5 | Cu—Ni | Ni—Co | (2) M Surface | 12 | 40 | 1.5 | 40 | 2.5 |
| Example 6 | Cu—Ni | Ni—Co | (2) M Surface | 9 | 35 | 2.2 | 40 | 2.5 |
| Example 7 | Cu—Ni | — | (2) S Surface | 12 | 45 | 1.5 | 40 | 2.5 |
| Example 8 | Cu—Ni | — | (2) S Surface | 9 | 45 | 1.5 | 40 | 2.5 |
| Example 9 | Cu—Ni | — | Rolled | 18 | 45 | 1.5 | 40 | 2.5 |
| Example 10 | Cu—Ni | — | Rolled | 12 | 45 | 1.5 | 40 | 2.5 |
| Example 11 | Cu—Ni—Co | — | (1) M Surface | 12 | 40 | 1.8 | 40 | 2.5 |
| Example 12 | Cu—Ni—Co | — | (1) M Surface | 12 | 40 | 4.5 | 40 | 2.5 |
| Example 13 | Cu—Ni—Co | — | (1) M Surface | 12 | 60 | 1 | 40 | 2.5 |
| Example 14 | Cu—Ni—Co | Ni | (2) M Surface | 18 | 45 | 1.8 | 40 | 2.5 |
| Example 15 | Cu—Ni—Co | Ni | (2) M Surface | 12 | 45 | 1.8 | 40 | 2.5 |
| Example 16 | Cu—Ni—Co | Ni | (2) M Surface | 9 | 45 | 1.8 | 40 | 2.5 |
| Example 17 | Cu—Ni—Co | — | (2) S Surface | 12 | 50 | 1.8 | 40 | 2.5 |
| Example 18 | Cu—Ni—Co | — | (2) S Surface | 9 | 50 | 1.8 | 40 | 2.5 |
| Example 19 | Cu—Ni—Co | — | Rolled | 18 | 50 | 1.8 | 40 | 2.5 |
| Example 20 | Cu—Ni—Co | — | Rolled | 12 | 50 | 1.8 | 40 | 2.5 |
| Example 21 | Cu—Co | Ni—Co | (1) M Surface | 18 | 50 | 1.5 | 37 | 2.5 |
| Example 22 | Cu—Co | Ni—Co | (1) M Surface | 12 | 50 | 1.5 | 37 | 2.5 |
| Example 23 | Cu—Co | Ni—Co | (1) M Surface | 9 | 50 | 1.5 | 37 | 2.5 |
| Example 24 | Cu—Co | Ni—Co | (2) M Surface | 18 | 50 | 1.5 | 37 | 2.5 |
| Example 25 | Cu—Co | Ni—Co | (2) M Surface | 12 | 50 | 1.5 | 37 | 2.5 |
| Example 26 | Co | Ni—Co | (2) M Surface | 12 | 20 | 2 | 37 | 2.5 |
| Example 27 | Co | Ni—Co | (2) M Surface | 12 | 20 | 6 | 37 | 2.5 |
| Example 28 | Co | Ni—Co | (2) M Surface | 12 | 30 | 4 | 37 | 2.5 |
| Comparative Example 29 | Cu—Ni | — | (1) M Surface | 18 | 20 | 1.5 | 40 | 2.5 |
| Comparative Example 30 | Cu—Ni | — | (1) M Surface | 12 | 40 | 0.8 | 40 | 2.5 |
| Comparative Example 31 | Cu—Ni | Ni—Co | (2) M Surface | 18 | 30 | 1 | 40 | 2.5 |
| Comparative Example 32 | Cu—Ni | Ni—Co | (2) M Surface | 12 | 20 | 1.5 | 40 | 2.5 |
| Comparative Example 33 | Cu—Ni | Ni—Co | (2) M Surface | 9 | 20 | 1 | 40 | 2.5 |
| Comparative Example 34 | Cu—Ni | — | (2) S Surface | 12 | 20 | 1.5 | 40 | 2.5 |
| Comparative Example 35 | Cu—Ni | — | (2) S Surface | 9 | 30 | 1.5 | 40 | 2.5 |
| Comparative Example 36 | Cu—Ni—Co | — | (1) M Surface | 12 | 40 | 1 | 40 | 2.5 |
| Comparative Example 37 | Cu—Ni—Co | — | (1) M Surface | 12 | 40 | 0.8 | 40 | 2.5 |
| Comparative Example 38 | Cu—Ni—Co | — | (1) M Surface | 12 | 20 | 1.5 | 40 | 2.5 |

TABLE 2

| | Plating Solution | Coat Plating Solution | ΔL | Chroma $[(a^*)^2 + (b^*)^2]^{1/2}$ | Glossiness | Reflectance Property | Roughness Ra | Rt | Rz | Etching Characteristics | Ni (mg/m$^2$) | Co (mg/m$^2$) |
|---|---|---|---|---|---|---|---|---|---|---|---|---|
| Example 1 | Cu—Ni | — | −81.1 | 13.3 | 11.4 | ○ | 0.14 | 0.83 | 0.47 | ○ | 450 | 0 |
| Example 2 | Cu—Ni | — | −80.3 | 13.7 | 15.2 | ○ | 0.17 | 0.97 | 0.63 | ○ | 435 | 0 |
| Example 3 | Cu—Ni | — | −78.6 | 13.6 | 16 | ○ | 0.19 | 1.09 | 0.88 | ○ | 641 | 0 |
| Example 4 | Cu—Ni | Ni—Co | −80.5 | 13.1 | 0.5 | ○ | 0.34 | 2.81 | 2.09 | ○ | 473 | 103 |
| Example 5 | Cu—Ni | Ni—Co | −79.1 | 13.3 | 0.7 | ○ | 0.37 | 2.73 | 1.95 | ○ | 486 | 117 |
| Example 6 | Cu—Ni | Ni—Co | −78.1 | 14.2 | 0.7 | ○ | 0.33 | 2.54 | 1.91 | ○ | 740 | 111 |
| Example 7 | Cu—Ni | — | −79.5 | 10.5 | 0.9 | ○ | 0.22 | 1.77 | 1.55 | ○ | 440 | 0 |
| Example 8 | Cu—Ni | — | −78.5 | 10.9 | 0.9 | ○ | 0.24 | 1.83 | 1.56 | ○ | 445 | 0 |
| Example 9 | Cu—Ni | — | −78.5 | 13.5 | 1 | ○ | 0.12 | 0.95 | 0.85 | ○ | 451 | 0 |
| Example 10 | Cu—Ni | — | −79.3 | 12.3 | 0.9 | ○ | 0.12 | 1.13 | 0.89 | ○ | 452 | 0 |
| Example 11 | Cu—Ni—Co | — | −78.9 | 15 | 11.6 | ○ | 0.14 | 0.85 | 0.51 | ○ | 24 | 131 |
| Example 12 | Cu—Ni—Co | — | −75.9 | 13.8 | 16.5 | ○ | 0.17 | 1.02 | 0.67 | ○ | 62 | 331 |
| Example 13 | Cu—Ni—Co | — | −74.1 | 13.2 | 16.2 | ○ | 0.17 | 1.14 | 0.9 | ○ | 20 | 112 |
| Example 14 | Cu—Ni—Co | Ni | −76.1 | 7.9 | 1.7 | ○ | 0.32 | 2.62 | 2.12 | ○ | 162 | 133 |
| Example 15 | Cu—Ni—Co | Ni | −73.2 | 7.3 | 0.7 | ○ | 0.47 | 3.64 | 3.21 | ○ | 159 | 130 |
| Example 16 | Cu—Ni—Co | Ni | −70.9 | 7.6 | 0.9 | ○ | 0.33 | 2.58 | 2.25 | ○ | 158 | 131 |
| Example 17 | Cu—Ni—Co | — | −74.3 | 6.9 | 0.8 | ○ | 0.23 | 1.71 | 1.53 | ○ | 49 | 492 |
| Example 18 | Cu—Ni—Co | — | −73.9 | 6.7 | 0.9 | ○ | 0.24 | 1.76 | 1.63 | ○ | 40 | 460 |
| Example 19 | Cu—Ni—Co | — | −76.2 | 9.8 | 0.9 | ○ | 0.12 | 0.96 | 0.83 | ○ | 56 | 452 |
| Example 20 | Cu—Ni—Co | — | −77.3 | 9.6 | 1.1 | ○ | 0.13 | 1.12 | 0.95 | ○ | 60 | 451 |
| Example 21 | Cu—Co | Ni—Co | −72.3 | 11.1 | 14.5 | ○ | 0.15 | 0.89 | 0.51 | ○ | 15 | 310 |
| Example 22 | Cu—Co | Ni—Co | −71.9 | 12.3 | 14.1 | ○ | 0.15 | 1.95 | 0.63 | ○ | 14 | 308 |
| Example 23 | Cu—Co | Ni—Co | −70.1 | 13.3 | 13.3 | ○ | 0.16 | 1.07 | 0.89 | ○ | 14 | 307 |
| Example 24 | Cu—Co | Ni—Co | −73.3 | 7.9 | 0.7 | ○ | 0.34 | 3.12 | 2.59 | ○ | 15 | 313 |
| Example 25 | Cu—Co | Ni—Co | −72.1 | 6.1 | 0.6 | ○ | 0.33 | 2.93 | 2.33 | ○ | 15 | 309 |
| Example 26 | Co | Ni—Co | −88 | 10.1 | 0.5 | ○ | 0.33 | 2.89 | 2.03 | ○ | 14 | 1051 |
| Example 27 | Co | Ni—Co | −91.9 | 9.7 | 0.4 | ○ | 0.34 | 2.91 | 1.97 | ○ | 15 | 3132 |
| Example 28 | Co | Ni—Co | −93.2 | 7.1 | 0.6 | ○ | 0.36 | 2.92 | 2.11 | ○ | 14 | 3109 |

Comparative Examples 29 to 38

An electrolytic copper foil or rolled copper foil having a thickness of 9, 12 and 18 μm was degreased, water washed, pickled and water washed, and a black plated layer was formed using the various types of plating baths described above. The plating conditions are shown in Table 1.

For degreasing, as with the Examples, a standard alkali degreasing fluid GN cleaner 87: 30 g/L was used, and electrolytic degreasing was performed using a stainless anode at 15 A/dm$^2$, for 5 seconds, at 40° C. Further, pickling was performed for 10 seconds at room temperature with H$_2$SO$_4$: 100 g/L.

As shown in Table 3, excluding Comparative Example 37, all Comparative Examples had a color difference ΔL that is inferior to the reference value (−70). In Comparative Example 37, chroma became significantly inferior to the reference value.

Those in which the color difference ΔL and chroma were inferior to the color difference ΔL reference value (−70) and chroma reference value c(15) showed inferior shielding performance, and are inadequate as a plasma display panel copper foil. In particular, Comparative Examples 29 and 30 showed inferior chroma, and the reflectance property deteriorated.

TABLE 3

| | Plating Solution | Coat Plating Solution | ΔL | Chroma $[(a^*)^2 + (b^*)^2]^{1/2}$ | Glossiness | Reflectance Property | Roughness Ra | Rt | Rz | Etching Characteristics | Ni (mg/m$^2$) | Co (mg/m$^2$) |
|---|---|---|---|---|---|---|---|---|---|---|---|---|
| Comparative Example 29 | Cu—Ni | — | −66.3 | 6.8 | 25.9 | x | 0.17 | 0.89 | 0.71 | ○ | 131 | 0 |
| Comparative Example 30 | Cu—Ni | — | −64.3 | 7.2 | 23.8 | x | 0.19 | 1.11 | 0.85 | ○ | 128 | 0 |
| Comparative Example 31 | Cu—Ni | Ni—Co | −61 | 8.4 | 0.7 | ○ | 0.33 | 2.71 | 1.98 | ○ | 148 | 105 |
| Comparative Example 32 | Cu—Ni | Ni—Co | −65.4 | 8.1 | 0.5 | ○ | 0.38 | 2.67 | 1.88 | ○ | 148 | 103 |
| Comparative Example 33 | Cu—Ni | Ni—Co | −64.2 | 8.3 | 0.7 | ○ | 0.38 | 2.72 | 2.20 | ○ | 147 | 103 |
| Comparative Example 34 | Cu—Ni | — | −60.1 | 8.9 | 0.8 | ○ | 0.22 | 1.73 | 1.62 | ○ | 129 | 0 |
| Comparative Example 35 | Cu—Ni | — | −62.2 | 8.3 | 0.9 | ○ | 0.23 | 1.74 | 1.66 | ○ | 129 | 0 |
| Comparative Example 36 | Cu—Ni—Co | — | −70.5 | 16.7 | 0.7 | ○ | 0.24 | 1.68 | 1.59 | ○ | 15 | 89 |
| Comparative Example 37 | Cu—Ni—Co | — | −54.9 | 14.9 | 0.5 | ○ | 0.17 | 0.97 | 0.63 | ○ | 10 | 59 |
| Comparative Example 38 | Cu—Ni—Co | — | −58.2 | 11.5 | 0.7 | ○ | 0.19 | 1.09 | 0.88 | ○ | 11 | 55 |

The results are shown in Table 3. Table 3 shows the type of plated layer, existence (type) of coat plating, color difference ΔL, chroma, glossiness, reflectance property, roughness (Ra, Rt, Rz), etching characteristic, Ni content, and Co content.

The copper foil with a blackened surface or layer according to the present invention is especially useful for a plasma display panel (PDP) and has superior shielding characteristics of effectively shielding electromagnetic waves, near infrared rays, stray light, outside light and the like, has sufficient contrast, has a deep blackened color, is able to limit the reflected light of incoming light from the outside and reflected light of outgoing light from a plasma display panel, and has superior etching characteristics.

The invention claimed is:

1. A copper foil with a blackened layer formed on one or both surfaces thereof, said blackened layer of said copper foil having a color difference $\Delta L^* \leq -70$ and chroma $C^* \leq 15$ when measured by a color difference meter represented by black, $\Delta L^* = -100$, and white, $\Delta L^* = 0$, and said blackened layer of said copper foil having coarsened grains of 1 μm or less and surface roughness Ra of 0.5 μm or less, Rt of 4.0 μm or less, and Rz of 3.5 μm or less.

2. A copper foil with blackened layer according to claim 1, wherein said blackened layer is an electro-plated coating of at least one of Co, Ni—Cu, Co—Cu and Ni—Co—Cu.

3. A copper foil with blackened layer according to claim 2, wherein said blackened layer is an Ni-Cu electro-plated coating and an Ni mass of deposit per unit area in the Ni—Cu plating is 200 to 1000 mg/m$^2$.

4. A copper foil with blackened layer according to claim 2, wherein said blackened layer is an Ni-Cu electro-plated coating and Ni+Co mass of deposit per unit area in the Ni—Co—Cu plating is 130 to 1000 mg/m$^2$.

5. A copper foil with blackened layer according to claim 2, wherein said blackened layer is an Ni-Cu electro-plated coating and a Co mass of deposit per unit area in the Co—Cu plating is 300 to 1000 mg/m$^2$.

6. A copper foil with blackened layer according to claim 2, wherein said blackened layer is an Ni-Cu electro-plated coating and a Co mass of deposit per unit area in the Co plating is 1000 to 5000 mg/m$^2$.

7. A copper foil with blackened layer according to claim 1, wherein the copper foil is an electrolytic copper foil or a rolled copper foil of 8 to 18 μm.

8. A copper foil with blackened layer according to claim 1, further comprising a rust prevention layer on said blackened layer.

9. A copper foil with blackened layer according to claim 8, wherein said rust prevention layer is of at least one of Cr, Zn, Zn—Ni, and Zn—Ni—P.

10. A copper foil with blackened layer according to claim 1, wherein said copper foil is a plasma display copper foil.

11. A copper foil wit blackened layer according to claim 1, wherein said blackened layer is an Ni—Cu electro-plated coating that is coated witb a layer of a Ni or Ni—Co electro-plated coating, and wherein an Ni+Co mass of deposit per unit area of a surface subject to the Ni or Ni—Co plating, after the Ni—Cu plating, is 250 to 1500 mg/m$^2$.

12. A copper foil with blackened layer according to claim 1, wherein said blackened layer is an Ni—Co—Cu electro-plated coating that is coated with a layer of a Ni or Ni—Co electro-plated coating, and wherein an Ni+Co mass of deposit per unit area of a plated surface subject to the Ni or Ni—Co plating, after the Ni—Co—Cu plating, is 250 to 1500 mg/m$^2$.

13. A copper foil with blackened layer according to claim 1, wherein said blackened layer is a Co—Cu electro-plated coating that is coated with a layer of a Ni or Ni—Co electro-plated coating, and wherein an Ni+Co mass of deposit per unit area of a plated surface subject to the Ni or Ni—Co plating, after the Co—Cu plating, is 350 to 1500 mg/m$^2$.

14. A copper foil with blackened layer according to claim 1, wherein said blackened layer is a Co electro-plated coating that is coated with a layer of a Ni or Ni—Co electro-plated coating, and wherein an Ni+Co mass of deposit per unit area of a plated surface subject to Ni or Ni—Co plating, after the Co plating, is 1050 to 2000 mg/m$^2$.

15. A copper foil with blackened layer according to claim 1, wherein the blackened layer has a glossiness $\leq 15$.

16. A copper foil with blackened layer according to claim 15, wherein said blackened layer is an electro-plated coating of at least one of Co, Ni—Cu, Co—Cu and Ni—Co—Cu.

17. A copper foil with blackened layer according to claim 16, wherein said blackened layer is an Ni-Cu electro-plated coating and an Ni mass of deposit per unit area in the Ni—Cu plating is 200 to 1000 mg/m$^2$.

18. A copper foil with blackened layer according to claim 16, wherein said blackened layer is an Ni-Cu electro-plated coating and Ni+Co mass of deposit per unit area in the Ni—Co—Cu plating is 130 to 1000 mg/m$^2$, 19. A copper foil with blackened layer according to claim 16, wherein said blackened layer is an Ni-Cu electro-plated coating and a Co mass of deposit per unit area in the Co—Cu plating is 300 to 1000 mg/m$^2$, 20. A copper foil with blackened layer according to claim 16, wherein said blackened layer is an Ni-Cu electro-plated coating and a Co mass of deposit per unit area in the Co plating is 1000 to 5000 mg/m$^2$.

21. A copper foil with blackened layer according to claim 16, wherein the copper foil is an electrolytic copper foil or a rolled copper foil of a thickness of 8 to 18 μm.

22. A copper foil with blackened layer according to claim 21, further comprising a rust prevention layer on said blackened layer.

23. A copper foil with blackened layer according to claim 22, wherein said rust prevention layer is of at least one of Cr, Zn, Zn—Ni, and Zn—Ni—P.

24. A copper foil with blackened layer according to claim 23, wherein said copper foil is a plasma display copper foil.

* * * * *

UNITED STATES PATENT AND TRADEMARK OFFICE
CERTIFICATE OF CORRECTION

PATENT NO. : 7,341,796 B2 Page 1 of 1
APPLICATION NO. : 10/597460
DATED : March 11, 2008
INVENTOR(S) : M. Hanafusa It is certified that error appears in the above-identified patent and that said Letters Patent is hereby corrected as shown below:

Column 4, Line 17 "-15 of a" should read --15 of a--.

Column 5, Line 28 "1000 mg/m2," should read --1000 $mg/m^2$--.

Column 5, Line 34 "5000 mg/m2," should read --5000 $mg/m^2$--.

Column 11, Line 22 "an Ni-Cu electro-plated" should read
--an Ni-Co-Cu electro-plated--.

Column 11, Line 26 "an Ni-Cu electro-plated" should read --an Co-Cu electro-plated--.

Column 11, Line 30 "an Ni-Cu electro-plated" should read --an Co electro-plated--.

Column 11, Line 35 "foil of 8" should read --foil of a thickness of 8--.

Column 12, Line 28 "an Ni-Cu electro-plated" should read
--an Ni-Co-Cu electro-plated--.

Column 12, Line 32 "an Ni-Cu electro-plated" should read --an Co-Cu electro-plated--.

Column 12, Line 35 "an Ni-Cu electro-plated" should read --an Co electro-plated--.

Signed and Sealed this

Seventeenth Day of June, 2008

JON W. DUDAS
*Director of the United States Patent and Trademark Office*